US012802926B2

(12) United States Patent
Tam et al.

(10) Patent No.: US 12,802,926 B2
(45) Date of Patent: Nov. 17, 2026

(54) ION IMPLANTER, CONTROL SYSTEM, AND TECHNIQUES FOR TUNING ION IMPLANTER

(71) Applicant: Applied Materials, Inc., Santa Clara, CA (US)

(72) Inventors: Wai Ming Tam, Georgetown, MA (US); William Herron Park, Jr., Marblehead, MA (US); Peter F. Kurunczi, Cambridge, MA (US); Maximilian Schneider, Boston, MA (US); Frank Sinclair, Hartland, ME (US); Scott E. Peitzsch, Tewksbury, MA (US); Benjamin Alexandrovich, Brookline, MA (US)

(73) Assignee: Applied Materials, Inc., Santa Clara, CA (US)

( * ) Notice: Subject to any disclaimer, the term of this patent is extended or adjusted under 35 U.S.C. 154(b) by 293 days.

(21) Appl. No.: 18/771,312

(22) Filed: Jul. 12, 2024

(65) Prior Publication Data

US 2026/0018378 A1 Jan. 15, 2026

(51) Int. Cl.
*H01J 37/30* (2006.01)
*H01J 37/08* (2006.01)
(Continued)

(52) U.S. Cl.
CPC ............ *H01J 37/304* (2013.01); *H01J 37/08* (2013.01); *H01J 37/1477* (2013.01); (Continued)

(58) Field of Classification Search
CPC ...... H01J 37/304; H01J 37/08; H01J 37/1477; H01J 37/3171; H01J 2237/04735; H01J 2237/24585
See application file for complete search history.

(56) References Cited

U.S. PATENT DOCUMENTS 6,137,112 A 10/2000 McIntyre
6,831,280 B2 12/2004 Scherer
(Continued)

FOREIGN PATENT DOCUMENTS

JP 2021177479 A 11/2021
WO 2020041034 A1 2/2020
(Continued)

OTHER PUBLICATIONS

International Search Report and Written Opinion for International Application No. PCT/US2025/030175, Filing date, May 20, 2025, 10 pages.

*Primary Examiner* — Nicole M Ippolito
(74) *Attorney, Agent, or Firm* — KDW Firm PLLC

(57) ABSTRACT

A method to operate an ion implanter. The method may include conducting an ion beam into an acceleration stage of a linear accelerator in the ion implanter, where the ion beam is a bunched ion beam. The method may also include applying an RF signal to the acceleration stage while the ion beam passes through the acceleration stage, the RF signal comprising a determined frequency and a determined amplitude, and performing a phase scan using the RF signal. The phase scan may include varying a phase of the RF signal at the acceleration stage over a plurality of phase values; and recording a plurality of arrival times at a monitor, situated downstream of the acceleration stage, the plurality of arrival times corresponding to the plurality of phase values, respectively.

20 Claims, 7 Drawing Sheets

(51) Int. Cl.

| | |
|---|---|
| ***H01J 37/14*** | (2006.01) |
| ***H01J 37/147*** | (2006.01) |
| ***H01J 37/304*** | (2006.01) |
| ***H01J 37/31*** | (2006.01) |
| ***H01J 37/317*** | (2006.01) |

(52) U.S. Cl.

CPC . *H01J 37/3171* (2013.01); *H01J 2237/04735* (2013.01); *H01J 2237/24585* (2013.01)

(56) References Cited

U.S. PATENT DOCUMENTS

| | | | | |
|---|---|---|---|---|
| 2017/0165504 | A1* | 6/2017 | Dollinger ............. | A61N 5/1048 |
| 2020/0234918 | A1* | 7/2020 | Sinclair ............... | H01J 37/3007 |
| 2021/0125810 | A1 | 4/2021 | Kowal | |

FOREIGN PATENT DOCUMENTS

| | | | |
|---|---|---|---|
| WO | 2022060470 | A1 | 3/2022 |
| WO | 2022211910 | A1 | 10/2022 |

* cited by examiner

ION IMPLANTER, CONTROL SYSTEM, AND TECHNIQUES FOR TUNING ION IMPLANTER

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via ion bombardment. Ion implantation systems may comprise an ion source and a series of beam-line components. The ion source may comprise a chamber where ions are generated. The ion source may also comprise a power source and an extraction electrode assembly disposed adjacent the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an RF voltage signal. Known LINACs are driven by an RF voltage applied at frequencies between 13.56 MHz-120 MHz.

In known LINACs (for the purposes of brevity, the term LINAC as used herein may refer to an RF LINAC using RF signals to accelerate an ion beam) in order to reach a targeted final energy, such as one MeV, several MeV, or greater, the ion beam may be accelerated in multiple acceleration stages. Each successive stage of the LINAC may receive the ion beam at increasingly higher energy, and accelerate the ion beam to still higher energy.

Current LINAC-based ion implanters may provide control systems that are used to ensure the proper timing of RF signals used to drive the different acceleration stages of the LINAC. For a given ion implantation recipe, which recipe may be tailored to a given ion species, targeted ion energy, and so forth, a setup procedure may be performed before ion implantation is commenced for implanting into wafers. As part of the setup procedure, the RF voltage and phase of resonators may be adjusted for each acceleration stage in a rather lengthy procedure.

With respect to these and other considerations the present disclosure is provided.

BRIEF SUMMARY

In one embodiment, a method to operate an ion implanter is provided. The method may include conducting an ion beam into an acceleration stage of a linear accelerator in the ion implanter, where the ion beam is a bunched ion beam. The method may also include applying an RF signal to the acceleration stage while the ion beam passes through the acceleration stage, the RF signal comprising a determined frequency and a determined amplitude, and performing a phase scan using the RF signal. The phase scan may include varying a phase of the RF signal at the acceleration stage over a plurality of phase values; and recording a plurality of arrival times at a monitor, situated downstream of the acceleration stage, the plurality of arrival times corresponding to the plurality of phase values, respectively.

In a further embodiment an ion implanter is provided. The ion implanter may include an ion source to generate an ion beam, and a linear accelerator, comprising a plurality of acceleration stages to accelerate the ion beam. As such, a given acceleration stage of the linear accelerator may be driven by an RF signal, comprising a determined frequency and a determined amplitude. The ion implanter may include a controller, coupled to the linear accelerator, where the controller includes a processor and a memory unit coupled to the processor, including a tuning routine. The tuning routine may be operative on the processor to control the ion implanter to apply the RF signal to the given acceleration stage while the ion beam passes through the acceleration stage, and perform a phase scan using the RF signal. The phase scan may include varying a phase of the RF signal at the given acceleration stage over a plurality of phase values, and recording a plurality of arrival times at a monitor, situated downstream of the given acceleration stage, the plurality of arrival times corresponding to the plurality of phase values, respectively.

In another embodiment, a controller for an ion implanter is provided. The controller may include a processor, and a memory unit coupled to the processor, including a tuning routine. The tuning routine may be operative on the processor to control the ion implanter for: applying an RF signal to an acceleration stage of a linear accelerator of the ion implanter while an ion beam passes through the acceleration stage, performing a phase scan using the RF signal, and generating an energy profile for the acceleration stage, based upon the phase scan. The tuning routine may be further operative of the processor for determining a zero synchronous phase based upon the energy profile; and setting an RF phase of the RF signal so as to impart a targeted acceleration into the ion beam, based upon the zero synchronous phase.

Figure 1A:
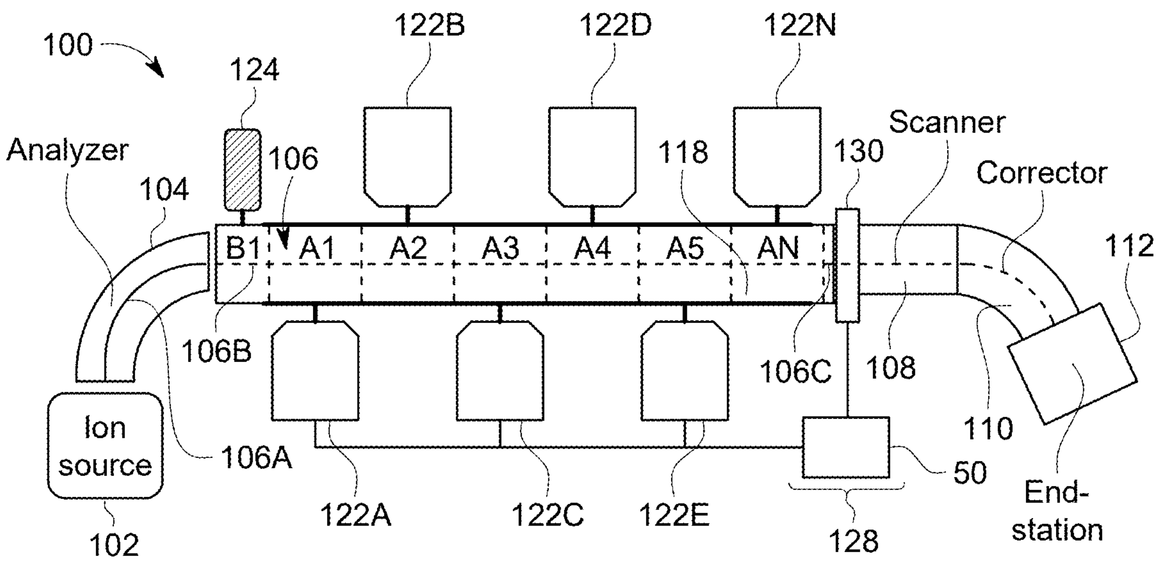
FIG. 1A depicts a schematic of an ion implanter apparatus, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved operation of high energy ion implantation systems and components, based upon a beamline architecture, and in particular, ion implanters based upon linear accelerators. For brevity, an ion implantation system may also be referred to herein as an "ion implanter." Various embodiments provide novel resonator structures for RF linear accelerators (LINACs).

FIG. 1A depicts a schematic of an ion implanter apparatus, according to embodiments of the disclosure. The ion implanter 100 includes a linear accelerator, referred to herein as LINAC 118. The ion implanter 100, may represent a beamline ion implanter, with some elements not shown for clarity of explanation. The ion implanter 100 may include an ion source 102, as known in the art. The ion source 102 may include an extraction system including extraction components and filters (not shown) to generate an ion beam 106A at a first energy. Examples of suitable ion energy for the first ion energy range from 5 keV to 300 keV, while the embodiments are not limited in this context. To form a high energy ion beam, the ion implanter 100 may include various additional components for accelerating the ion beam 106. As output by the ion source 102, the ion beam 106A may be a continuous ion beam.

The ion implanter 100 may include an analyzer 104, functioning to analyze the ion beam 106 as in known apparatus, by changing the trajectory of the ion beam 106, as shown. The ion implanter 100 may also include a buncher 124, which component may form an upstream part of an RF linear accelerator, shown as LINAC 118. The buncher 124 may be arranged as in known apparatus to output the initially-continuous ion beam, meaning ion beam 106A, as a bunched ion beam 106B. The LINAC 118 may include various acceleration stages to accelerate the bunched ion beam 106B by application of an RF signal at the different stages. The LINAC may output the bunched ion beam 106B as a high energy ion beam 106C. The ion implanter 100 may include various additional components, such as a scanner 108, to scan the high energy ion beam 106C, such as in a transverse direction to a direction of propagation of the high energy ion beam 106C. The ion implanter may further include components such as a corrector 110 and end station 112, as known in the art.

To impart a target final energy to the high energy ion beam 106C, the LINAC 118 may include a series of RF assemblies, where a given RF assembly is arranged to deliver a given RF signal to a given acceleration stage of the LINAC 118. These RF assemblies are shown as assembly 122A, assembly 122B, assembly 122C, assembly 122D, assembly 122E, and assembly 122N. The RF signal generated by a given assembly serves to generate an accelerating RF electric field between electrodes that are contained in a given acceleration stage, as detailed with respect to FIG. 1B. The final energy imparted into the bunched ion beam 106B will depend upon the amplitude of the RF signals applied at each acceleration stage of the LINAC 118, the total number of acceleration stages, as well as the timing of the RF signals as applied to the different acceleration stages as the bunched ion beam 106B is conducted therethrough.

In the example of FIG. 1A, the LINAC 118 is depicted as having a buncher B1, an upstream-most acceleration stage, shown as acceleration stage A1, an acceleration stage A2, an acceleration stage A3, an acceleration stage A4, acceleration stage A5, and acceleration stage AN, where AN may represent a downstream-most acceleration stage, with N representing any suitable number. Thus, while 6 acceleration stages are explicitly depicted in FIG. 1A, in various embodiments, a linear accelerator may include fewer or a larger number of acceleration stages. As the bunched ion beam 106B passes through successive acceleration stages of the LINAC 118, the bunched ion beam 106B will be accelerated to a high energy based upon the number of acceleration stages and the amplitude of the RF signal applied at each acceleration stage, among other factors, as noted above.

Figure 1B:
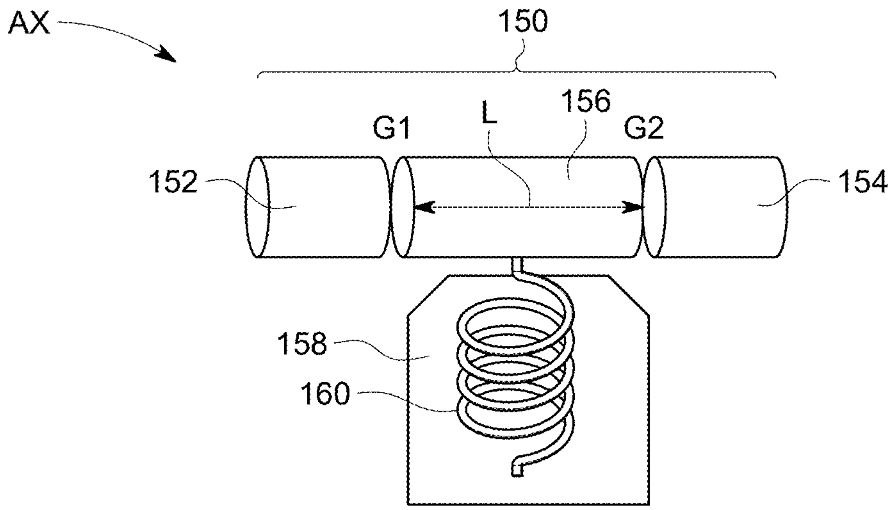
FIG. 1B depicts details of an exemplary acceleration stage, shown as acceleration stage.

To illustrate how energy is coupled into a bunched ion beam using the assemblies (122A-122N), FIG. 1B depicts details of an exemplary acceleration stage, shown as acceleration stage AX, which stage may be representative of any of the acceleration stages (A1-AN) shown in FIG. 1A. The acceleration stage AX may include a drift tube assembly 150, as well as a resonator 158. In various non-limiting embodiments, the drift tube assembly 150 may be a double gap configuration or a triple gap configuration. The configuration explicitly shown in FIG. 1B is a double gap configuration. In this arrangement, the drift tube assembly 150 includes a first grounded drift tube 152, a second grounded drift tube 154, and a powered drift tube 156. As suggested, the first grounded drift tube 152 and the second grounded drift tube 154 may be coupled to ground potential. The powered drift tube 156 is coupled to a resonator coil 160 that delivers an RF voltage signal, which RF voltage signal causes an RF field to develop in the gap G1 between the first grounded drift tube 152 and the powered drift tube 156, as well as an RF field in the gap G2 between the powered drift tube 156 and the second grounded drift tube 154. The timing of the phase of an RF signal as applied to the powered drift tube 156 will affect how an ion bunch that passes through gap G1 or gap G2 is accelerated by the acceleration stage AX, as detailed further with respect to FIG. 4.

Figure 1C:
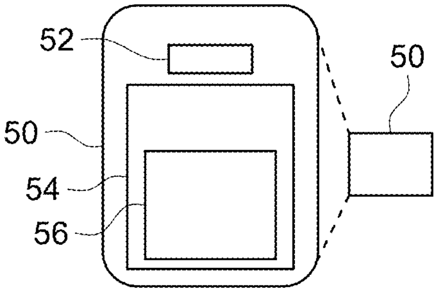
FIG. 1C shows the exemplary controller.

Referring again to FIG. 1A, in order to adjust and control the timing of RF signals applied to the various stages of the LINAC 118, the ion implanter 100 may be equipped with a tuning system 128 that includes a controller 50, as well as a beam monitor assembly 130 that is arranged to detect the high energy ion beam 106C. Details of the controller 50 are provided in FIG. 1C, with operation described further below.

Figure 2A:
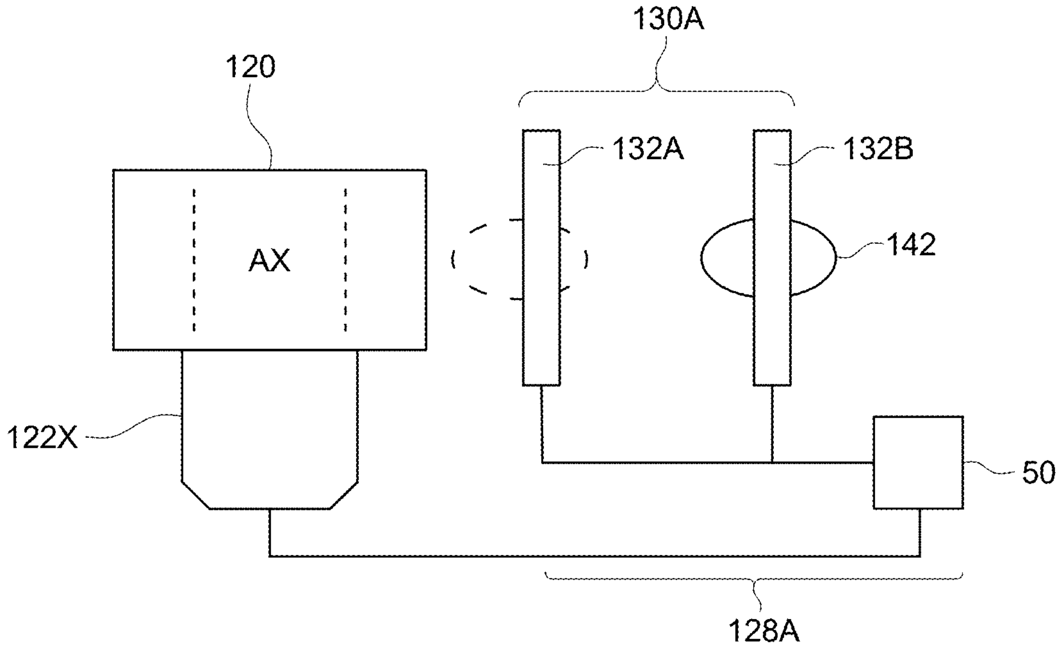
FIG. 2A shows one embodiment of a tuning system.
Figure 2B:
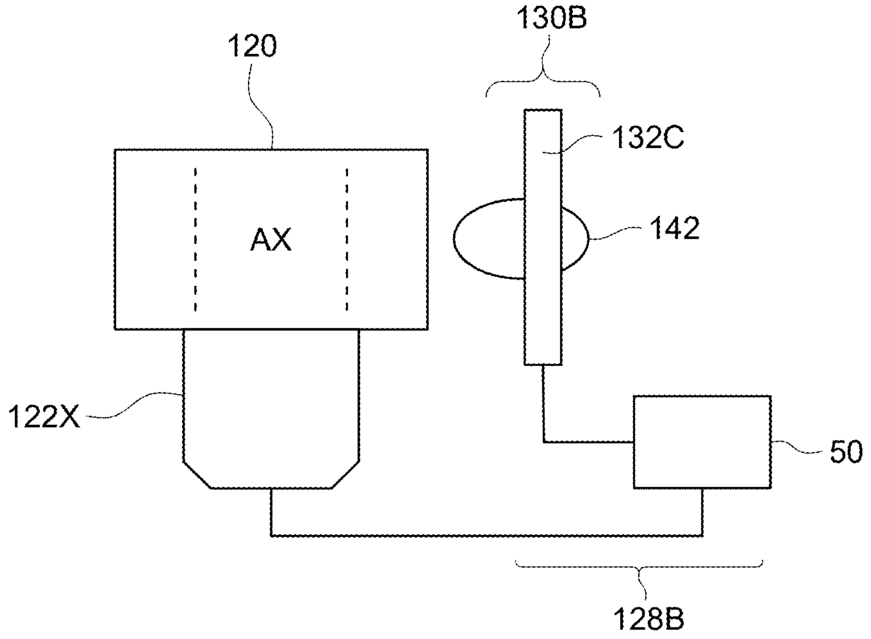
FIG. 2B shows another embodiment of a tuning system.

Turning to FIG. 2A there is shown one variant of the tuning system 128 of FIG. 1A, while FIG. 2B depicts a second variant of the tuning system 128. In particular, the tuning system 128A includes monitor assembly 130A that has a first beam monitor 132A and a second beam monitor 132B, disposed downstream to the first beam monitor 132A. In various non-limiting embodiments, a beam monitor as disclosed herein may be a capacitive monitor, an inductive monitor, or other suitable ion beam monitor as known in the art. In the scenario depicted in FIG. 2A, an acceleration stage of the LINAC 118 is being monitored by the tuning system 128A. The acceleration stage is depicted as stage AX, which designation may refer to an acceleration stage located at any position along the LINAC 118. The stage AX is powered by an RF assembly 122X that is arranged to deliver an RF signal to a bunched ion beam that traverses the stage AX through a drift tube assembly, as generally depicted in FIG. 1B. As the bunched ion beam 142 traverses the LINAC 118 the bunched ion beam will emerge from the LINAC 118 into a downstream portion of an ion implanter, such as ion implanter 100, where the monitor assembly 130A is disposed.

As the bunched ion beam 142 traverses the monitor assembly 130A, the bunched ion beam 142 will be detected as a series of ion bunches that are detected at different instances in time by the first beam monitor 132A and the second beam monitor 132B. In operation, the tuning system 128A may adjust the operating parameters that are applied to the stage AX by the RF assembly 122X, in particular, the phase of an RF signal that drives the stage AX. As explained with respect to FIGS. 3-6, as a result of adjusting the phase of the RF signal applied to the stage AX, the energy of a detected ion bunch will change. Moreover, the detection of the series of ion bunches forming the ion beam 142 will form a detection pattern that is characteristic of the ion energy of the ion beam 142. By suitable analysis of the detection pattern generated as a function of RF phase, a given stage, such as stage AX may be tuned to a suitable phase for processing the bunched ion beam 142, as detailed below.

Turning to FIG. 2B, the tuning system 128B includes monitor assembly 130B that has just one beam monitor, shown as beam monitor 132C, disposed downstream to the stage AX. As explained further below, the phase of an RF signal applied to stage AX may be varied, causing the timing of the bunched ion beam 142 as detected at the beam monitor 132C to vary, such that a detection pattern is generated as a function of RF phase. Based on this detection pattern for a given stage, such as stage AX, the RF phase may be tuned to a suitable phase for processing the bunched ion beam 142.

In accordance with embodiments of the disclosure the tuning system 128 may measure the energy of a bunched ion beam as a function of RF phase applied to a given acceleration stage, and may accordingly adjust RF phase for the given acceleration stage. As used herein, the term 'synchronous ion' may refer to an ion located at the centroid of an ion bunch. The term 'Synchronous phase' may refer the phase difference between the RF voltage on an accelerating electrode(s) of a resonator driving a given stage and the arrival of the synchronous ion at the accelerating gap(s) between the electrodes. The term 'Zero synchronous phase' may refer to the synchronous phase such that the synchronous ion experiences the largest acceleration from the gap, and thus where a maximum energy is imparted into the ion bunch.

Figure 3:
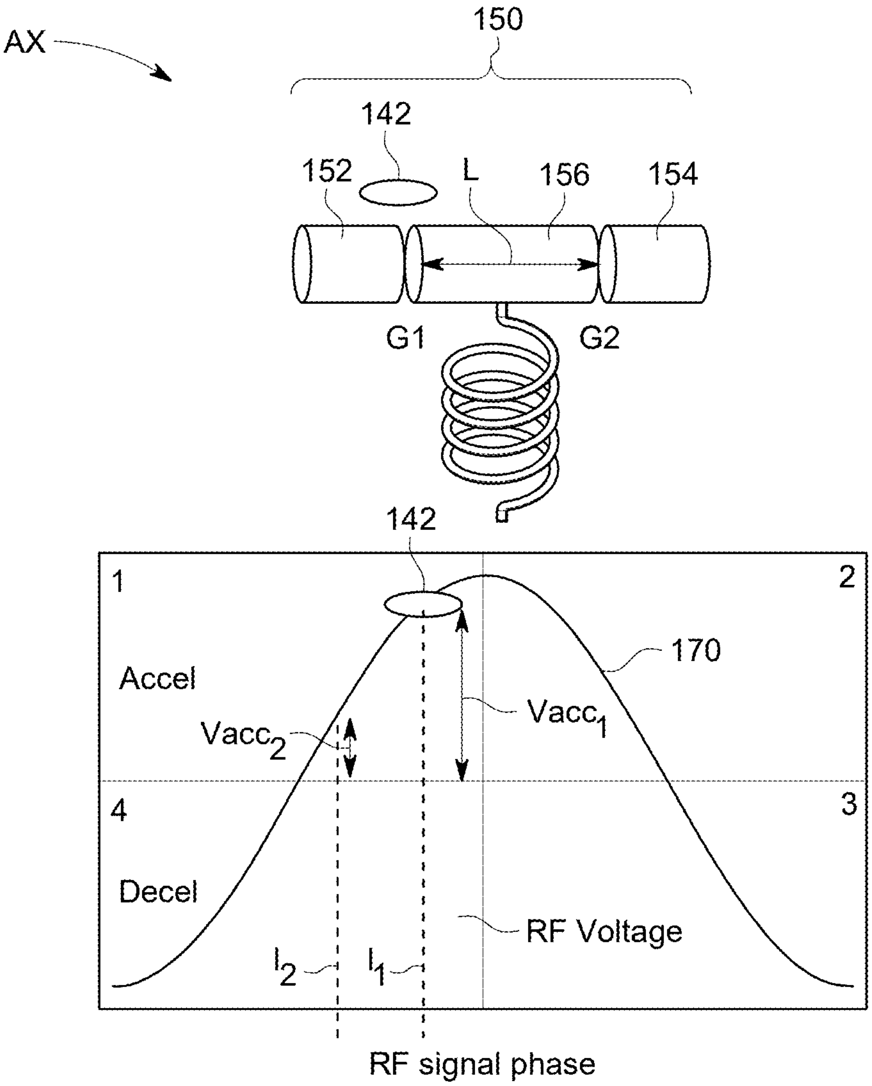
FIG. 3 depicts one scenario of operation of an acceleration stage.

To explain further, the operation of the tuning systems of FIG. 2A and FIG. 2B, FIG. 3 depicts one scenario of operation of an acceleration stage AX. In this example, the bunched ion beam 142 is located at a gap G1 at an instant in time. Because an RF voltage is applied to the powered drift tube 156, an RF field will develop in the gap G1 between the first grounded drift tube 152 and the powered drift tube 156, as discussed above. FIG. 3 depicts an exemplary RF signal, denoted as the RF signal 170, as applied to the powered drift tube 156. One period of a RF signal is shown, where voltage may vary from an accelerating voltage (upper side of the graph) to a decelerating voltage (lower side of the graph).

At a given instance when the ion bunch of the bunched ion beam 142 enters an acceleration gap, such as gap G1, the ion bunch will experience an electric field between the powered drift tube 156 and the first grounded drift tube 152, for example, where the electric field is proportional to the amplitude of the RF voltage applied to the powered drift tube 156 at the given instance. In the example shown in FIG. 3, the bunched ion beam 142 may enter the gap G1 at the instance $I_1$, where the amplitude of the voltage ($Vacc_1$) shown by RF signal 170 is close to a maximum accelerating voltage. Accordingly, the given ion bunch will be accelerated by an electric field that is close to a maximum, thus increasing the ion energy of the bunched ion beam 142 by a relatively larger amount. If the bunched ion beam 142 enters the gap G1 at an earlier instance, shown as instance $I_2$ the bunched ion beam will be accelerated to a lesser extent by the lesser voltage ($Vacc_1$) applied by the RF signal 170. Thus, the timing of the RF signal 170 with respect to the position of an ion bunch of the bunched ion beam 142 will affect the energy imparted to the bunched ion beam 142 at a given acceleration gap, in each acceleration stage of a LINAC.

Figure 4:
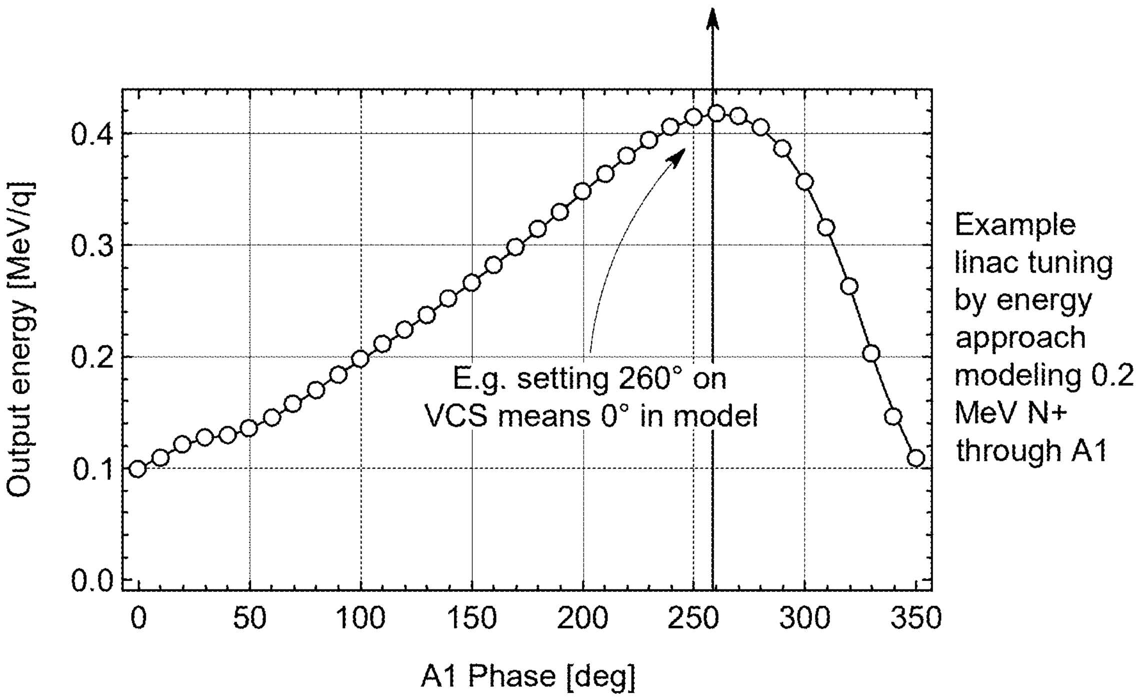
FIG. 4 depicts an exemplary curve depicting output energy of a bunched ion beam as a function of phase of a given acceleration stage.

FIG. 4 depicts an exemplary curve depicting output energy of a bunched ion beam as a function of phase of a given acceleration stage, in this case representing stage A1. In this case, a 200 keV $N^+$ beam is conducted through the acceleration stage. As illustrated, the output energy varies as a function of phase, with a minimum at 0 degrees and a maximum at 260 degrees. The minimum output energy, 100 keV/q, and maximum output energy, ~420 keV/q, where q is a unit charge on an ion, take into account the fact that the ion bunch enters the stage A1 with an initial finite energy. Generally, the change in energy ΔE that is imparted by a given acceleration stage by a sinusoidal rf voltage may be given as $$\Delta E = qVo\cos(\omega t - \phi VCS) = qVo\cos(\phi s) \qquad (1)$$

The maximum energy imparted into a ion bunch, Max ΔE may occur when ϕs=0, which condition corresponds to a zero synchronous phase for synchronous ions of the ion bunch. Note that with respect to any given RF signal that is applied to a given acceleration stage for a given ion species, this phase where Max ΔE may occur may not be known a priori. In FIG. 4 the Max ΔE is observed at 260 degrees. With this knowledge, the phase of the RF signal applied to the stage A1 may be adjusted so as to impart a targeted acceleration into an ion bunch passing through stage A1. Thus, curve of FIG. 4 provides a correlation between the phase of the RF signal applied through a resonator to a given drift tube and the bunched ion beam. The value of 260 degrees may be said to correspond to a zero synchronous phase for the ion beam at the given acceleration stage, meaning a phase where a peak in beam energy is generated at the given acceleration stage.

Note that various considerations may call for the phase applied to the bunched ion beam to be displaced from the phase of Max ΔE. Based upon the curve of FIG. 4, for example, the RF phase applied to stage A1 may be set to 250 degrees to support longitudinal focusing of the bunched ion beam. With reference also to FIG. 3, longitudinal focusing would occur at 250 degrees because ions located at the leading edge of a bunch will experience a relatively lower accelerating voltage than ions entering at the trailing edge of the bunch, due to the slight increase in voltage amplitude during the time interval required for the ion bunch to pass into the accelerating gap.

Figure 5:
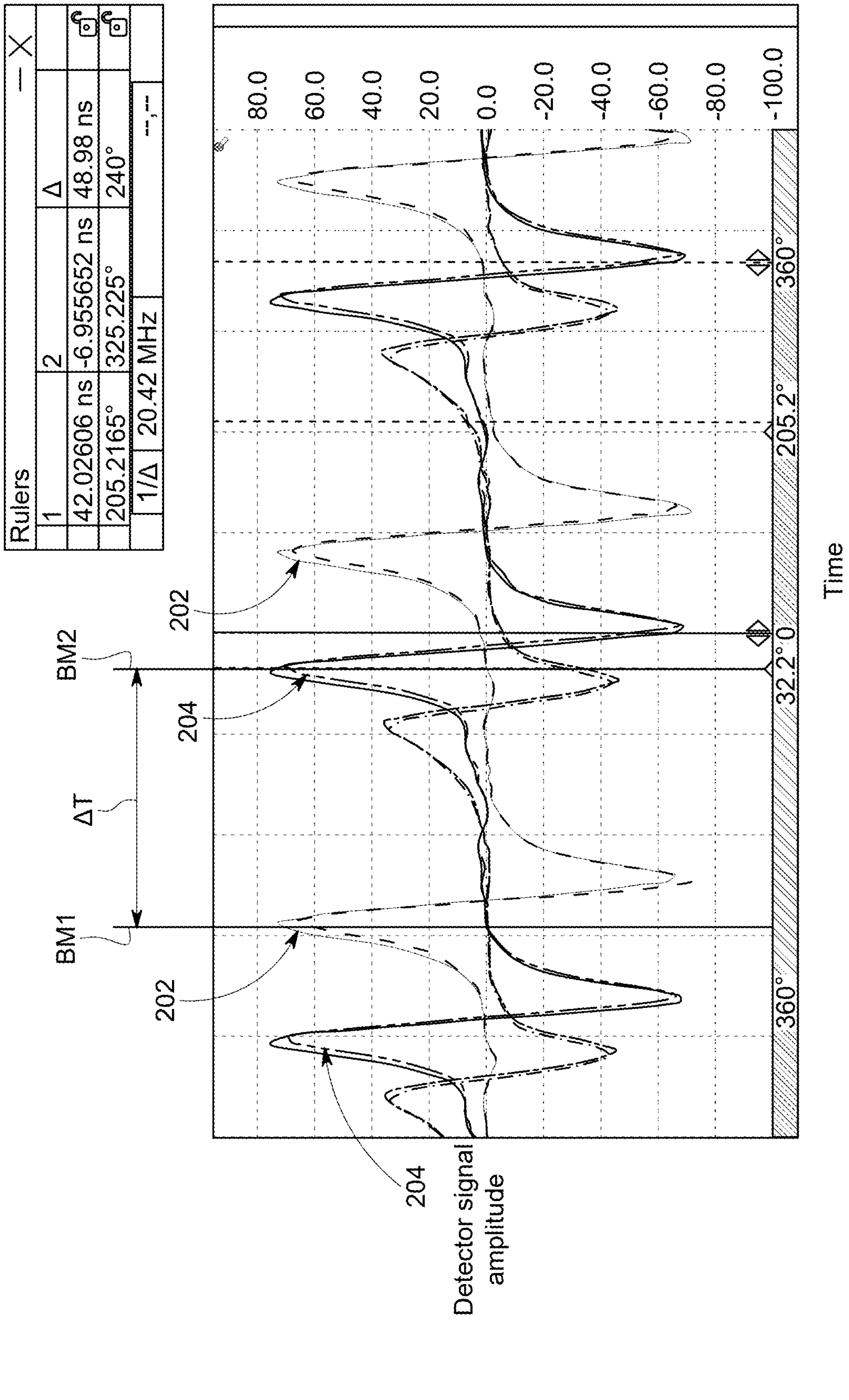
FIG. 5 shows an exemplary monitor output for measuring ion energy using a tuning system.

Turning to FIG. 5, there is shown an exemplary monitor output that may be used for measuring ion energy using a tuning system, according to some embodiments of the disclosure. In this example, the monitor output represents a series of curves that are generated by two different beam monitors, located downstream of an acceleration stage. The acceleration stage includes a double gap drift tube assembly, arranged generally as described above, where the powered drift tube is driven by an RF signal at 13.56 MHz. As ion bunches of a bunched ion beam traverse the drift tube assembly, the ion bunches are accelerated by the RF signal and achieve an output energy that is recorded by the two beam monitors, BM1 and BM2 (see FIG. 2A for an exemplary arrangement of two beam monitors).

As shown in FIG. 5 a curve 202 and a curve 204 each exhibit a series of peaks that represent intensity as a function of time, and further indicate the instance when an ion bunch of a bunched ion beam passes a respective beam monitor. Within each curve, the series of peaks are regularly spaced between one another, with a separation in time that is characteristic of the bunch spacing between successive bunches. Thus, the curve 202 represents the detection of a series of ion bunches and BM1, while the curve 204 represents the detection of the same series of ion bunches at BM2. Moreover, the two curves are offset in time from one another, with a Dt value indicating the time delay between when a given ion bunch passes BM1 and when the given ion bunch passes BM2. Thus, given the physical separation of BM1 and BM2, the velocity of an ion bunch is readily obtained from Dt. From the ion bunch velocity, the ion energy is directly obtained based upon the mass of the ions of the ion bunch.

In one embodiment, the RF phase of an RF (voltage) signal applied to the given acceleration stage may be varied in a series of steps in a so-called phase scan, while the amplitude (and frequency) of the RF signal is kept constant, and the curves 202 and curve 204 are recorded. As depicted previously with respect to FIG. 4, the RF phase may be varied in a series steps, while the ion energy is recorded for each value (phase angle) of the RF phase. In the example of FIG. 5, the ion energy will be determined by measurement of a Dt value at each RF phase angle. This procedure may be repeated for any suitable set of RF phase angles so as to generate an output energy curve as a function of RF phase that is characteristic of the given acceleration stage.

Figure 6:
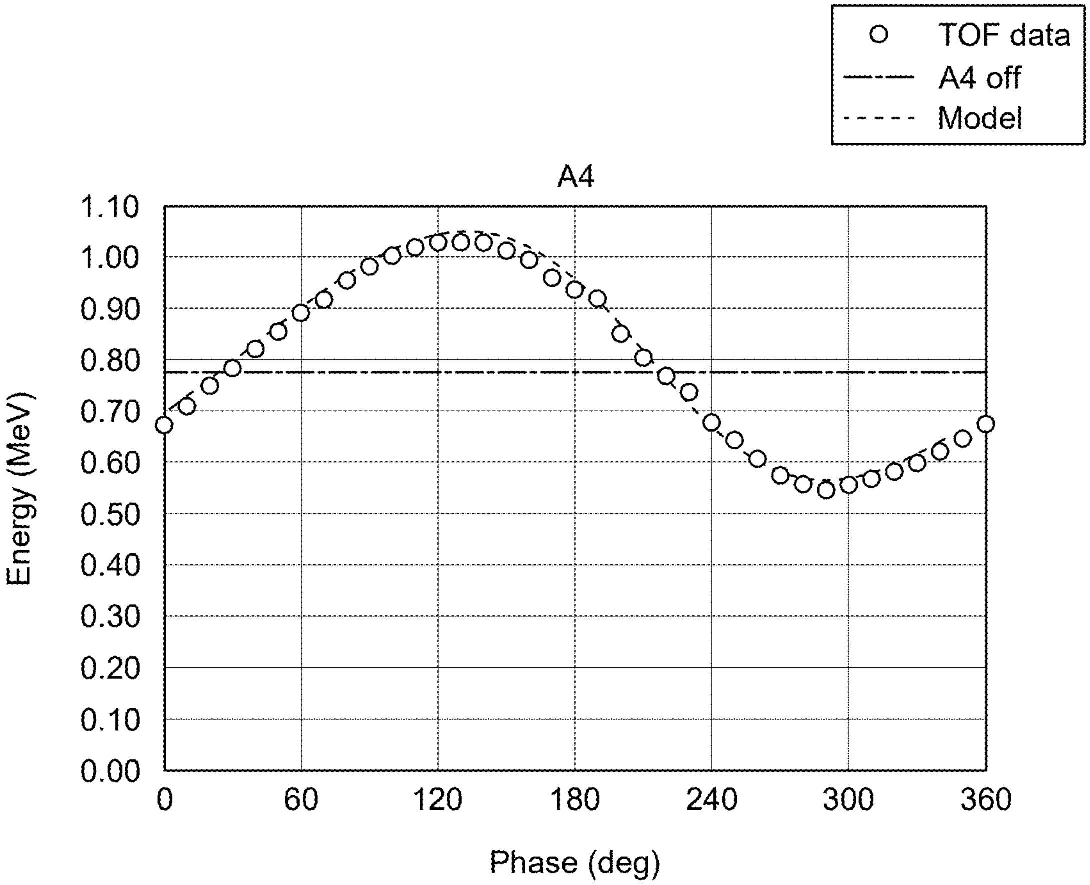
FIG. 6 shows an idealized curve in dashed lines, and experimental data measured by a monitor assembly arranged according to the present embodiments.

Turning to FIG. 6, there is shown a baseline in dashed lines, and experimental data that plots the output ion energy of ion bunches accelerated through an acceleration stage A4, where the output energy is measured by a monitor assembly arranged according to the present embodiments. The output energy is measured at a series of RF phase angles in increments of 10 degrees from 0 to 360 degrees. The output energy varies in a sinusoidal fashion, mimicking the sinusoidal shape of the applied RF voltage to the acceleration stage. In this example, the value of the output energy varies from a minimum of approximately 54 keV to a maximum of approximately 102 keV. The horizontal dashed line corresponds to the output energy detected when the A4 acceleration stage is not powered. Thus, this energy represents the ion energy of an ion bunch as received at the A4 acceleration stage, which value is approximately 78 keV. Note that for approximately half of the cycle (between 0 and 360 degrees), the ion bunch is decelerated to exhibit an output energy less than 78 keV, while for the rest of the cycle the ion bunch is accelerated to an energy higher than 78 keV. Note also that the peak in output energy occurs at 135 degrees RF phase. Thus, for the A4 acceleration stage, to achieve maximum acceleration, the phase angle may be set to 135 degrees given the initial ion energy and ion species in question.

According to various embodiments of the disclosure, the above procedure may be employed across the entirety of acceleration stages of a LINAC in order to tune the acceleration stages by setting suitable phase values for RF signals that drive the different acceleration stages. In one example, the procedure may be first employed at a most upstream acceleration stage (e.g., A1), and then performed successively at downstream stages, A2, A3, etc., so as to tune each acceleration stage of a LINAC to a targeted RF phase that yields a targeted output energy. Note that the phase angle need not be set to produce a maximum output energy at any given stage, as discussed above. The energy profiles may be mapped for the different stages so that the suitable phase angle is applied for each give acceleration stage of a LINAC, in order to achieve a targeted final ion beam property, including a final ion energy after exiting the LINAC.

Table I below provides a summary of procedures to be applied in one embodiment for tuning a LINAC. In the example of Table I, four acceleration stages are depicted. The procedures shown in table I are equally applicable to LINACs including fewer stages or more stages. In the embodiment of Table I, a phase scan for each acceleration stage is performed in sequence, starting from the most upstream acceleration stage (A1) to the most downstream acceleration stage (A4). The phase scan is based upon measurement of output energy of a bunched ion beam as a function of applied RF phase for a given acceleration stage. The top row of Table I list the various stages of the LINAC, as well as the beam monitors. In the lower four rows, the status of the various acceleration stages is listed for a series of four phase scan procedures that are individually applied to the different stages. In the example shown, a buncher is ON in all measurements, meaning that a bunched ion beam is provided to each acceleration stage where a phase scan is performed. The bunched ion beam will be provided to the acceleration stages at a suitable ion energy, where each acceleration stage will then increase the ion energy in steps.

TABLE I

| | Buncher | A1 | A2 | A3 | A4 | BM1 & BM2 |
|---|---|---|---|---|---|---|
| Map for A1 | On | Phase scan | Off | Off | Off | Time of flight |
| Map for A2 | On | On | Phase scan | Off | Off | Time of flight |
| Map for A3 | On | On | On | Phase scan | Off | Time of flight |
| Map for A4 | On | On | On | On | Phase scan | Time of flight |

In the first procedure, the acceleration stage A2, acceleration stage A3, and acceleration stage A4 are set to OFF, meaning that no power is delivered to the respective drift tubes in said acceleration stages. A phase scan is performed for acceleration stage A1, generally as described above with respect to FIGS. 3-5. In brief, the phase scan involves recording beam energy as a function of RF phase applied to acceleration stage A1 for a bunched ion beam, by recording arrival times of the bunched ion beam, thus providing time-of-flight measurements based on two beam monitors, BM1 and BM2. Note that since the acceleration stages are OFF, downstream to A1, the phase scan that is performed provides the energy profile of just acceleration stage A1. The phase scan may be used to determine a zero synchronous phase for the acceleration stage A1, and may thus be used to set an appropriate phase offset for an RF signal applied to the acceleration stage A1, in order to achieve a targeted output energy from acceleration stage A1.

In a second procedure, the acceleration stage A3 and acceleration stage A4 are set to OFF, while the buncher and acceleration stage A1 are set to ON. A phase scan is performed for acceleration stage A2, similarly to the phase scan for acceleration stage A1. Since acceleration stage A3 and acceleration stage A4 are set to OFF, the ion energy measured as a function of phase angle at BM1 and BM2 represents the output energy for the bunched ion beam after being accelerated through both acceleration stage A1 and acceleration stage A2. Again, the phase scan may be used to determine a zero synchronous phase for the acceleration stage A2, given the accelerated bunched ion beam that is received from acceleration stage A1.

In a third procedure, the acceleration stage A4 is set to OFF, while the buncher and acceleration stage A1 and acceleration stage A2 are set to ON. A phase scan is performed for acceleration stage A3, similarly to the phase scan for acceleration stage A1 and A2. Since acceleration stage acceleration stage A4 is set to OFF, the ion energy measured as a function of phase angle at BM1 and BM2 represents the output energy for the bunched ion beam after being accelerated through acceleration stages A1, A2, and A3. Again, the phase scan may be used to determine a zero synchronous phase for the acceleration stage A3, given the accelerated bunched ion beam that is received from acceleration stage A2.

In a fourth procedure, the buncher, acceleration stage A1, acceleration stage A2, and acceleration stage A3 are set to ON. A phase scan is performed for acceleration stage A4, similarly to the phase scan for acceleration stage A1, A2, and A3. The ion energy measured as a function of phase angle at BM1 and BM2 represents the output energy for the bunched ion beam after being accelerated through all four acceleration stages A1, A2, and A3, and A4. Again, the phase scan may be used to determine a zero synchronous phase for the acceleration stage A4, given the accelerated bunched ion beam that is received from acceleration stage A3.

As such, in the approach as outlined in Table I, a given phase scan performed for any given stage of a LINAC is predicated upon the fact that phase scans have been performed on all upstream stages to the given stage, and the targeted maximum applied voltages and phases have been set and applied to those upstream stages at the time of the given phase scan.

In various embodiments, the tuning of a LINAC as outlined, for example, at Table I, may be performed periodically during the operation of an ion implanter. As an example, when an implantation recipe is to be changed, such as changing ion species, ion energy, ion dose, etc., the various stages of the LINAC may be tuned as outlined in Table I, so the phase relationship between a bunched ion beam and the RF signal generated at the resonators of the LINAC may be more accurately determined. In other examples, the tuning of the LINAC may be performed according to an interval based upon a number of wafer starts, such as every 1000 wafers, and so forth.

Note that while the beam monitor assembly 130 is depicted as being disposed downstream to the LINAC 118, in other embodiments a beam monitor assembly, formed of one or more monitors, may be disposed within the LINAC 118. For example, a monitor assembly may be disposed between A4 and A5, or between A3 and A2. In addition, multiple monitor assemblies may be located within the LINAC 118 in other embodiments.

Figure 7:
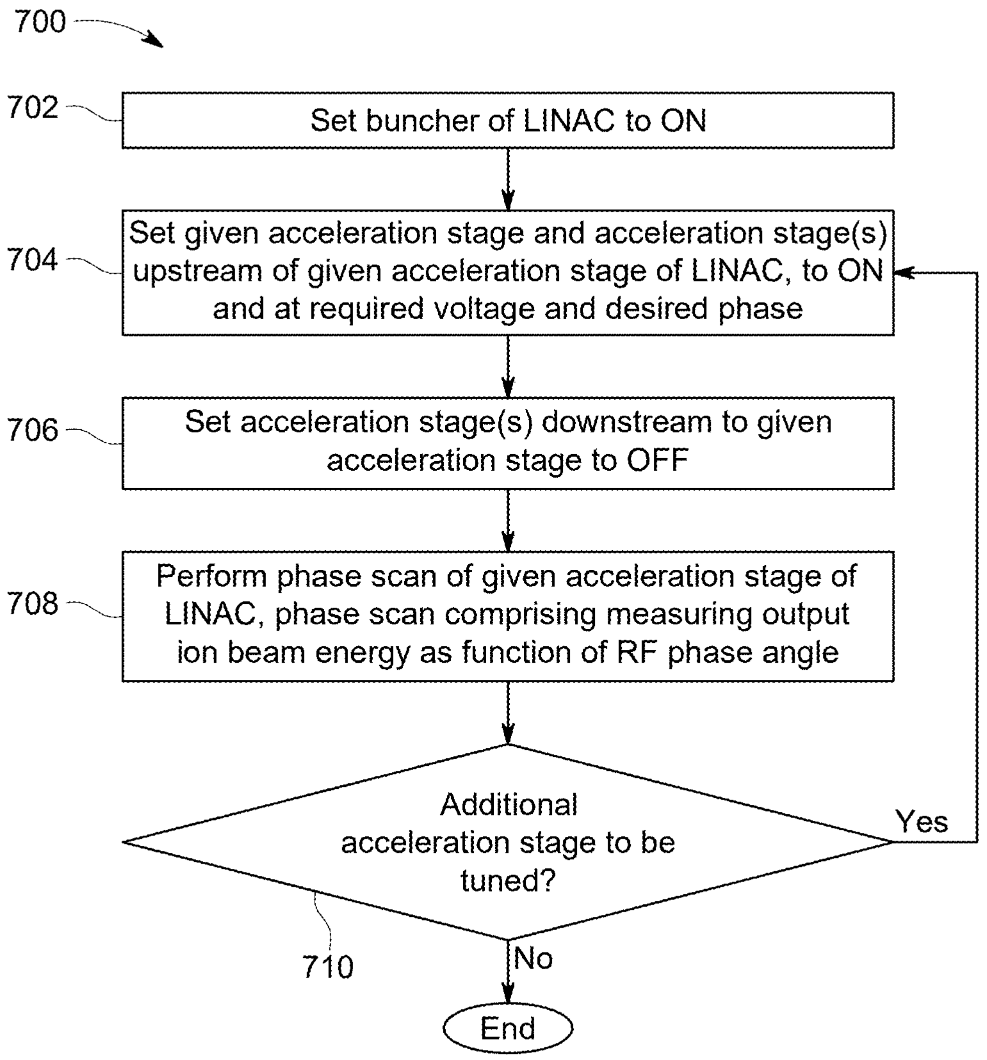
FIG. 7 presents an exemplary process flow, in accordance with embodiments of the disclosure.

FIG. 7 presents an exemplary process flow 700, in accordance with embodiments of the disclosure. At block 702 a buncher of a linear accelerator is set to ON. As such, the buncher may generate a bunched ion beam upon receiving a continuous ion beam.

At block 704, a given acceleration stage to be tuned may be set to ON, meaning that an RF voltage signal is sent to the drift tube electrode of the given acceleration stage, at a determined frequency and a determined amplitude. Any other acceleration stages of the linear accelerator that are upstream to the given acceleration stage are also set to ON.

At block 706, any acceleration stages of the linear accelerator that are disposed downstream to the given acceleration stage to be tuned, are set to OFF.

At block 708, a phase scan is applied to the given acceleration stage, meaning that the phase of the RF voltage signal as applied to the given acceleration stage is varied, while the output energy of a bunched ion beam that is output from the given acceleration stage is measured as a function of the phase. In one non-limiting embodiment, the output energy may be measured using a plurality of monitors that perform a time-of-flight measurement on the bunched ion beam.

At block 710, a decision is made as to whether additional acceleration stages are to be tuned. If so, the flow returns to block 704. If not, the process ends.

Referring again to FIG. 1C, there are shown details of a controller 50, arranged to implement the procedures of the present embodiments as set forth above. In one embodiment, the controller 50 may include a processor 52, such as a known type of microprocessor, dedicated processor chip, general purpose processor chip, or similar device. The controller 50 may further include a memory or memory unit 54, coupled to the processor 52, where the memory unit 54 contains a tuning routine 56. The tuning routine 56 may be operative on the processor 52 to control the ion implanter 100, and in particular to aid in establishing the proper phase settings at acceleration stages of the LINAC 118. In particular, the tuning routine 56 may be operative on the processor 52 to control the ion implanter 100 to: apply an RF signal to an acceleration stage of the LINAC 118 of the ion implanter 100 while the bunched ion beam 106B passes through the acceleration stage. The tuning routine 56 may be further operative on the processor 52 to control the ion implanter 100 to perform a phase scan using the RF signal; generate an energy profile for the acceleration stage, based upon the phase scan; determine a zero synchronous phase based upon the energy profile; and set the RF phase so as to impart a targeted acceleration into a bunched ion beam 106B, based upon the zero synchronous phase. In one implementation, the tuning routine 56 may be operative on the processor 52 to perform the procedures as outlined in Table I. for tuning multiple acceleration stages, such as each acceleration stage of a linear accelerator.

The memory unit 54 may comprise an article of manufacture. In one embodiment, the memory unit 54 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In view of the above, the present disclosure provides at least the following advantages. For one advantage, tuning time for a multi-stage linear accelerator may be substantially reduced, and recipe generation can be facilitated. As another advantage, the phase offset between adjacent stages need not be determined. In particular, a master clock referencing for phase control of the RF signals applied to the different acceleration stages is rendered unnecessary using the tuning approach of the present embodiments.

While certain embodiments of the disclosure have been described herein, the disclosure is not limited thereto, as the disclosure is as broad in scope as the art will allow and the specification may be read likewise. Therefore, the above description is not to be construed as limiting. Those skilled in the art will envision other modifications within the scope and spirit of the claims appended hereto.

The invention claimed is:

1. A method to operate an ion implanter, comprising:

conducting an ion beam into an acceleration stage of a linear accelerator in the ion implanter, the ion beam comprising a bunched ion beam;

applying an RF signal to the acceleration stage while the ion beam passes through the acceleration stage, the RF signal comprising a determined frequency and a determined amplitude; and performing a phase scan using the RF signal, the phase scan comprising:

varying a phase of the RF signal at the acceleration stage over a plurality of phase values; and recording a plurality of arrival times at a monitor, situated downstream of the acceleration stage, the plurality of arrival times corresponding to the plurality of phase values, respectively.

2. The method of claim 1, further comprising generating an energy profile for the acceleration stage, based upon the phase scan, the energy profile corresponding to an ion energy, determined at the monitor, as a function of phase of the RF signal, as applied to the acceleration stage.

3. The method of claim 2, further comprising determining a zero synchronous phase for the acceleration stage, based upon the energy profile, wherein the zero synchronous phase corresponds to a phase where a maximum energy is imparted into the ion beam by the acceleration stage.

4. The method of claim 1, wherein the monitor comprising a pair of monitors, wherein an ion energy of the ion beam is determined by a time-of-flight between a first monitor of the pair of monitors and a second monitor of the pair of monitors.

5. The method of claim 3, further comprising:

setting the phase of the RF signal so as to impart a targeted acceleration into the bunched ion beam, based upon the zero synchronous phase.

6. The method of claim 5, wherein the conducting the ion beam, the applying the RF signal, the performing the phase scan, the determining a zero synchronous phase and the setting the phase of the RF signal comprise tuning an acceleration stage, the method further comprising tuning at least one additional acceleration stage of the linear accelerator, to complete a tuning of the linear accelerator.

7. The method of claim 6, wherein the tuning the linear accelerator comprises:

tuning a first acceleration stage, the first acceleration stage being a most upstream acceleration stage of the linear accelerator, wherein all other acceleration stages of the linear accelerator are set to OFF.

8. The method of claim 7, wherein the tuning the linear accelerator further comprises:

tuning an additional acceleration stage, wherein the first acceleration stage and any other acceleration stage, upstream to the at least one additional acceleration stage are set to ON, and wherein all other acceleration stages of the linear accelerator stage are set to OFF.

9. The method of claim 1, wherein the monitor is disposed within the linear accelerator.

10. The method of claim 1, wherein the monitor is disposed upstream to at least one acceleration stage of the linear accelerator.

11. An ion implanter, comprising:

an ion source to generate an ion beam;

a linear accelerator, comprising a plurality of acceleration stages to accelerate the ion beam, wherein a given acceleration stage is driven by an RF signal, comprising a determined frequency and a determined amplitude; and a controller, coupled to the linear accelerator, the controller comprising:

a processor; and a memory unit coupled to the processor, including a tuning routine, the tuning routine operative on the processor to control the ion implanter to:

apply the RF signal to the given acceleration stage while the ion beam passes through the acceleration stage; and perform a phase scan using the RF signal, the phase scan comprising:

varying a phase of the RF signal at the given acceleration stage over a plurality of phase values; and recording a plurality of arrival times at a monitor, situated downstream of the given acceleration stage, the plurality of arrival times corresponding to the plurality of phase values, respectively.

12. The ion implanter of claim 11, wherein the tuning routine operative on the processor to:

generate an energy profile for the given acceleration stage, based upon the phase scan, the energy profile corresponding to an ion energy, determined at the monitor, as a function of the phase of the RF signal, as applied to the given acceleration stage.

13. The ion implanter of claim 12, wherein the tuning routine operative on the processor to:

determine a zero synchronous phase for the given acceleration stage, based upon the energy profile, wherein the zero synchronous phase corresponds to a phase where a maximum energy imparted is into the ion beam by the given acceleration stage.

14. The ion implanter of claim 13 the tuning routine operative on the processor to control the ion implanter to:

set the phase of the RF signal so as to impart a targeted acceleration into the ion beam, based upon the zero synchronous phase.

15. The ion implanter of claim 14, wherein the applying the RF signal, the performing the phase scan, the determining the zero synchronous phase, and the setting the phase of the RF signal comprise performing an acceleration stage tune, the tuning routine operative on the processor to control the ion implanter to:

perform the acceleration stage tune on at least one additional acceleration stage of the linear accelerator.

16. A controller for an ion implanter, comprising:

a processor; and a memory unit coupled to the processor, including a tuning routine, the tuning routine operative on the processor to control the ion implanter for:

applying an RF signal to an acceleration stage of a linear accelerator of the ion implanter while an ion beam passes through the acceleration stage, performing a phase scan using the RF signal;

generating an energy profile for the acceleration stage, based upon the phase scan;

determining a zero synchronous phase based upon the energy profile; and setting an RF phase of the RF signal so as to impart a targeted acceleration into the ion beam, based upon the zero synchronous phase.

17. The controller of claim 16, the tuning routine operative on the processor to control the ion implanter to:

perform the phase scan by:

varying a phase of the RF signal at the acceleration stage over a plurality of phase values; and recording a plurality of arrival times at a monitor, situated downstream of the acceleration stage, the plurality of arrival times corresponding to the plurality of phase values, respectively.

18. The controller of claim 16, wherein the zero synchronous phase corresponds to a phase where a maximum energy is imparted into the ion beam by the acceleration stage.

19. The controller of claim 16, wherein the applying the RF signal, the performing the phase scan, the determining the zero synchronous phase, and the setting the phase of the RF signal comprise performing an acceleration stage tune, the tuning routine operative on the processor to control the ion implanter to:

perform the acceleration stage tune on at least one additional acceleration stage of the linear accelerator.

20. The controller of claim 19, the tuning routine operative on the processor to control the ion implanter to: perform the acceleration stage tune by:

setting the at least one additional acceleration stage and any other acceleration stage, upstream to the at least one additional acceleration stage to ON, and set all other acceleration stages of the linear accelerator to OFF.

* * * * *